(12) United States Patent
Kagaya

(10) Patent No.: US 10,470,293 B2
(45) Date of Patent: Nov. 5, 2019

(54) PRINTED CIRCUIT BOARD AND OPTICAL TRANSCEIVER WITH THE PRINTED CIRCUIT BOARD

(71) Applicant: Oclaro Japan, Inc., Kanagawa (JP)

(72) Inventor: Osamu Kagaya, Tokyo (JP)

(73) Assignee: Lumentum Japan, Inc., Kanagawa (JP)

( * ) Notice: Subject to any disclaimer, the term of this patent is extended or adjusted under 35 U.S.C. 154(b) by 0 days.

(21) Appl. No.: 16/185,036

(22) Filed: Nov. 9, 2018

(65) Prior Publication Data

US 2019/0159334 A1 May 23, 2019

(30) Foreign Application Priority Data

Nov. 21, 2017 (JP) .................................. 2017-223643

(51) Int. Cl.
| | |
|---|---|
| H05K 1/02 | (2006.01) |
| H05K 1/11 | (2006.01) |
| G02B 6/42 | (2006.01) |
| H04B 10/40 | (2013.01) |
| H04B 10/80 | (2013.01) |

(Continued)

(52) U.S. Cl.
CPC ......... *H05K 1/0222* (2013.01); *G02B 6/4246* (2013.01); *G02B 6/4281* (2013.01); *H04B 10/40* (2013.01); *H04B 10/50* (2013.01); *H04B 10/60* (2013.01); *H04B 10/801* (2013.01); *H05K 1/0225* (2013.01); *H05K 1/0245* (2013.01); *H05K 1/115* (2013.01); *H01R 12/73* (2013.01); *H05K 1/117* (2013.01); *H05K 1/147* (2013.01); *H05K 1/181* (2013.01); *H05K 2201/093* (2013.01); *H05K 2201/09609* (2013.01); *H05K 2201/09636* (2013.01); *H05K 2201/10045* (2013.01)

(58) Field of Classification Search
None
See application file for complete search history.

(56) References Cited

U.S. PATENT DOCUMENTS

2008/0224117 A1* 9/2008 Iwayama ............... H01L 27/226
257/4
2008/0227311 A1* 9/2008 Chan .................... H05K 1/0216
439/74

(Continued)

FOREIGN PATENT DOCUMENTS

| JP | 2014-138015 A | 7/2014 |
|---|---|---|
| JP | 2016-006874 A | 1/2016 |

*Primary Examiner* — Darren E Wolf
(74) *Attorney, Agent, or Firm* — Mattingly & Malur, PC

(57) ABSTRACT

The present invention provides a printed circuit board comprising: a dielectric layer (130); N pairs of differential signal vias (2) which penetrate through the dielectric layer wherein N is an integer more than one; N pairs of first strip conductors (101, 102) disposed on a first surface of the dielectric layer; a first ground conductor layer (103) disposed in the dielectric layer forming N first differential transmission lines (100) with the N pairs of first strip conductors and the dielectric layer; N pairs of second strip conductors (111,112) disposed on a second surface of the dielectric layer; a second ground conductor layer (113) disposed in the dielectric layer forming N of second differential transmission lines (110) with the N pairs of second strip conductors and the dielectric layer.

10 Claims, 13 Drawing Sheets

(51) Int. Cl.
  *H05K 1/14* (2006.01)
  *H01R 12/73* (2011.01)
  *H05K 1/18* (2006.01)
  *H04B 10/50* (2013.01)
  *H04B 10/60* (2013.01)

(56) References Cited

U.S. PATENT DOCUMENTS

| | | | |
|---|---|---|---|
| 2009/0263140 A1* | 10/2009 | Kagaya | H05K 1/0224 |
| | | | 398/139 |
| 2012/0229998 A1* | 9/2012 | Kagaya | H01P 1/02 |
| | | | 361/777 |
| 2014/0197899 A1 | 7/2014 | Kawai | |
| 2015/0357760 A1 | 12/2015 | Aihara et al. | |

* cited by examiner

PRINTED CIRCUIT BOARD AND OPTICAL TRANSCEIVER WITH THE PRINTED CIRCUIT BOARD

CROSS-REFERENCE TO RELATED APPLICATION

The present application claims priority from Japanese application JP 2017-223643, filed on Nov. 21, 2017, the content of which is hereby incorporated by reference into this application.

BACKGROUND OF THE INVENTION

1. Field of the Invention

The invention relates to a printed circuit board and optical transceiver with the printed circuit board.

2. Description of the Related Art

As a broadband network has become more popular recently, an optical transceiver for optical fiber transmission is designed so as to realize higher transmission rate, smaller size and lower-cost. At present, the optical transceiver with a bit rate of 100 Gbit/s has been commercially available in order to realize higher rate of the optical transceiver. For the smaller size and lower-cost of the optical transceiver, the smaller sized casing and reduced number of components of the optical transceiver has been promoted. As a result, commonly used optical transceiver has a form factor and an electrical interface compatible to MSA (Multi Source Agreement) named QSFP28.

The optical transceiver comprises an electrical interface for serial data with 4 by 25 Gbit/s and a printed circuit board on which four channels of differential transmission lines for reception and four channels of differential transmission lines for transmission are arranged. For example, on the reception side of the optical transceiver, the optical transceiver is connected, via a flexible board connected to a four-channel ROSA (Receiver Optical Subassembly), to the four channels of differential transmission lines and converts optical reception signals into electrical signals by the ROSA. The differential transmission lines are connected to a four-channel CDR (Clock Data Recovery) IC, and the electrical signals are input to the optical transceiver via the differential transmission lines. As the optical transceiver has been miniaturized, the printed circuit board of the optical transceiver is required to have components of the optical transceiver disposed on the printed circuit board in a highly dense manner. For example in case the printed circuit board has a limited area for the components to dispose on the printed circuit board, the printed circuit is connected to the flexible printed circuit of the ROSA on a first surface of the printed circuit board while the CDR IC is disposed on the opposite second surface of the printed circuit board. In such a case, four pairs of differential signals vias are needed to dispose the differential transmission lines both on the first and second surfaces.

As a measure for a printed circuit board with less areas for components on the printed circuit board, JP2014-138015A discloses a printed circuit board having pairs of differential signal vias, each pair arranged to suppress any crosstalk between neighboring pairs. The described printed circuit board has paired-vias wherein paired-vias possessed by a specified differential signal via for transmitting a differential signal different from signal of another differential signal via adjacent thereto are arranged on a locus of a point distanced equally from each of the paired-vias possessed by another differential signal via.

JP2016-006874A discloses a printed circuit board having pairs of differential signal vias wherein the pairs are arranged such that some pairs form a broadside-coupled structure and other pairs form an edge-coupled structure. The described printed circuit board utilizes a positive polarity of a forward (far-end) crosstalk of the edge-coupled pairs and a negative polarity of a forward crosstalk of the broadside-coupled pairs to offset both crosstalk.

However, on the printed circuit board in JP2014-138015A, neighboring pairs of differential signal vias should be arranged such that one pair of the neighboring pairs is oriented by 90 degree with respect to the other pair. Thus, for example, if the four-channel of differential transmission lines are disposed on the first surface linearly, the four-channels of differential transmission lines have to be drawn so as to detour around the point where the four-channels of differential transmission lines are connected to the respective differential signal vias. In such a case, the differential transmission lines occupy a significant part of an area on the printed circuit board, and thus increases asymmetry of each differential transmission line, thereby increasing degree of conversion of a differential mode to a common mode. As a result, the printed circuit board in JP2014-138015A hardly realizes high-density arrangement or high transmission property of the differential transmission lines.

The printed circuit board in JP2016-006874A utilizes a broadside coupling between differential signal vias. Since the "broadside coupled" differential signal vias induce inductive coupling, closed arrangement of neighboring broadside-coupled paired differential signal vias in the high density increases inductive coupling of the neighboring broadside-coupled paired differential signal vias, thereby increasing crosstalk of the neighboring broadside-coupled pairs of differential signal vias. That is because the closed arrangement causes the crosstalk of the neighboring broadside-coupled pairs of differential signal vias to be dominant, and thus the crosstalk cannot be suppressed. Therefore, the printed circuit board in JP2016-006874A hardly realizes high-density arrangement of the differential transmission lines.

Furthermore, if the "broadside-coupled" differential signal vias are employed, for example, the four-channels of differential transmission lines are arranged on the first surface of the printed circuit board in a highly dense manner, the differential transmission lines should be drawn to detour around the point where the differential transmission lines are connected to the respective differential signal vias. In such a case, the drawn differential transmission line makes occupation area increase on the printed circuit board, and thus increases asymmetry of each differential transmission line, thereby increasing the degree of conversion of the differential mode to the common mode. As a result, the printed circuit board in JP2016-006874A hardly realizes high-density arrangement or high transmission property of the differential transmission lines.

SUMMARY OF THE INVENTION

It is an object of the present invention to provide a printed circuit board which realizes miniaturization of the printed circuit board and ensures integrity of a transmission waveform transmitted through the printed circuit board, and to provide an optical transceiver comprising the printed circuit board.

(1) A printed circuit board according to a first aspect of the invention comprises: a dielectric layer; N pairs of differential signal vias which penetrate through the dielectric layer wherein N is an integer more than one; N pairs of first strip conductors disposed on a first surface of the dielectric layer; a first ground conductor layer disposed in the dielectric layer forming N first differential transmission lines with the N pairs of first strip conductors and the dielectric layer; N pairs of second strip conductors disposed on a second surface of the dielectric layer; a second ground conductor layer disposed in the dielectric layer forming N of second differential transmission lines with the N pairs of second strip conductors and the dielectric layer, wherein the N pairs of first strip conductors and the N pairs of second strip conductors are connected to each other via the N pairs of differential signal vias; and first and second ground conductor layers have first and second single openings to insulate the first and second ground conductor layers from the N pairs of differential signal vias, respectively, and wherein the N pairs of differential signal vias penetrate through the first and second single openings and are arranged along one direction in the first and second single openings.

(2) The printed circuit board according to (1) may further comprise (2N+2) ground conductor vias arranged around each of the N pairs of differential signal vias, wherein two of the (2N+2) ground conductor vias may be disposed between two neighboring pairs of the N pairs of differential signal vias, and may face each other across the first and second single openings; and each of the (2N+2) ground conductor vias may be connected to the first and second ground conductor layers outside the first and second single openings.

(3) In the printed circuit board according to (1) or (2), where $D_1$ represents a center-to-center distance between two neighboring pairs of differential signal vias of the N pairs of differential signal vias; P represents a center-to-center distance between two neighboring ones of the first differential transmission lines connected to the two neighboring pairs of differential signal vias, $(D_1, P)$ may lie within a quadrangle having the following apexes: (0.6 mm, 1.2 mm), (0.9 mm, 1.6 mm), (1.2 mm, 2.2 mm) and (0.6 mm, 2.2 mm).

(4) A printed circuit board according to a second aspect of the invention comprises: a dielectric layer; N pairs of differential signal vias which penetrate through the dielectric layer wherein N is an integer more than one; N pairs of first strip conductors disposed on a first surface of the dielectric layer; a first ground conductor layer disposed in the dielectric layer forming N of first differential transmission lines with the N pairs of first strip conductors and the dielectric layer; N pairs of second strip conductors disposed on a second surface of the dielectric layer; and a second ground conductor layer disposed in the dielectric layer forming N of second differential transmission lines with the N pairs of second strip conductors and the dielectric layer, wherein the N pairs of first strip conductors and the N pairs of second strip conductors are connected to each other via the N pairs of differential signal vias; and where $D_1$ represents a center-to-center distance between two neighboring pairs of differential signal vias of the N pairs of differential signal vias; P represents a center-to-center distance between two neighboring ones of the first differential transmission lines connected to the two neighboring pairs of differential signal vias, $(D_1, P)$ may lie within a quadrangle having the following apexes: (0.6 mm, 1.2 mm), (0.9 mm,1.6 mm), (1.2 mm, 2.2 mm) and (0.6 mm, 2.2 mm).

(5) In the printed circuit board according to (4), the first and second ground conductor layers have the first and second single openings to insulate the first and second ground conductor layers from the N pairs of differential signal vias, respectively; and the N pairs of differential signal vias penetrate through the first and second single openings and are arranged along one direction in the first and second single openings.

(6) The printed circuit board according to (4) or (5) may further comprise (2N+2) ground conductor vias arranged around each of the N pairs of differential signal vias, wherein two of the (2N+2) ground conductor vias may be disposed between two neighboring pairs of the N pairs of differential signal vias, and may face each other across the first and second single openings; and each of the (2N+2) ground conductor vias may be connected to the first and second ground conductor layers outside the first and second single openings.

(7) An optical transceiver comprises the printed circuit board according to any one of (1)-(6).

(8) The optical transceiver according to (7) may further comprise an optical transmitter subassembly configured to output an optical signal, an optical receiver subassembly configured to receive the optical signal and then convert the optical signal to an electrical signal, a flexible printed circuit having N third differential transmission lines formed on the flexible printed circuit, an integrated circuit (IC) and a housing accommodating the printed circuit board, the optical receiver subassembly, the flexible printed circuit, and the IC, wherein the electrical signal may be connected to the first differential transmission lines of the printed circuit board via the third differential transmission lines of the flexible printed circuit.

The printed circuit board of the invention eliminates any needs to draw the differential transmission lines to detour by arranging the pairs of differential signal vias along one direction through the first and second single openings in the first and second ground conductor layers, respectively. Thus, the printed circuit board can be miniaturized.

The printed circuit board of the invention allows all lengths of the pairs of differential transmission lines to be substantially equal to each other by arranging the pairs of differential signal vias along one direction through the first and second single openings in the first and second ground conductor layers, respectively. Thus, the printed circuit board can suppress the degree of conversion of the differential mode to the common mode, and thus maintain a good transmission property of the differential transmission lines in a required range of frequencies.

The printed circuit board of the invention can at least partially offset the forward-crosstalk from the capacitive and inductive couplings of differential signal vias by arranging the pairs of differential signal vias along one direction through the first and second single openings in the first and second ground conductor layers, respectively. Thus, the printed circuit board can reduce the amount of the forward crosstalk of the channels.

In this way, the printed circuit board of the invention can maintain the good transmission property of differential transmission lines and reduce the amount of the forward crosstalk of the channels, thereby ensuring the integrity of transmission waveform transmitted through the printed circuit board.

BRIEF DESCRIPTION OF THE DRAWINGS

The invention will be described in detail with reference to the following drawings in which.

DETAILED DESCRIPTION OF THE INVENTION

Figure 1:
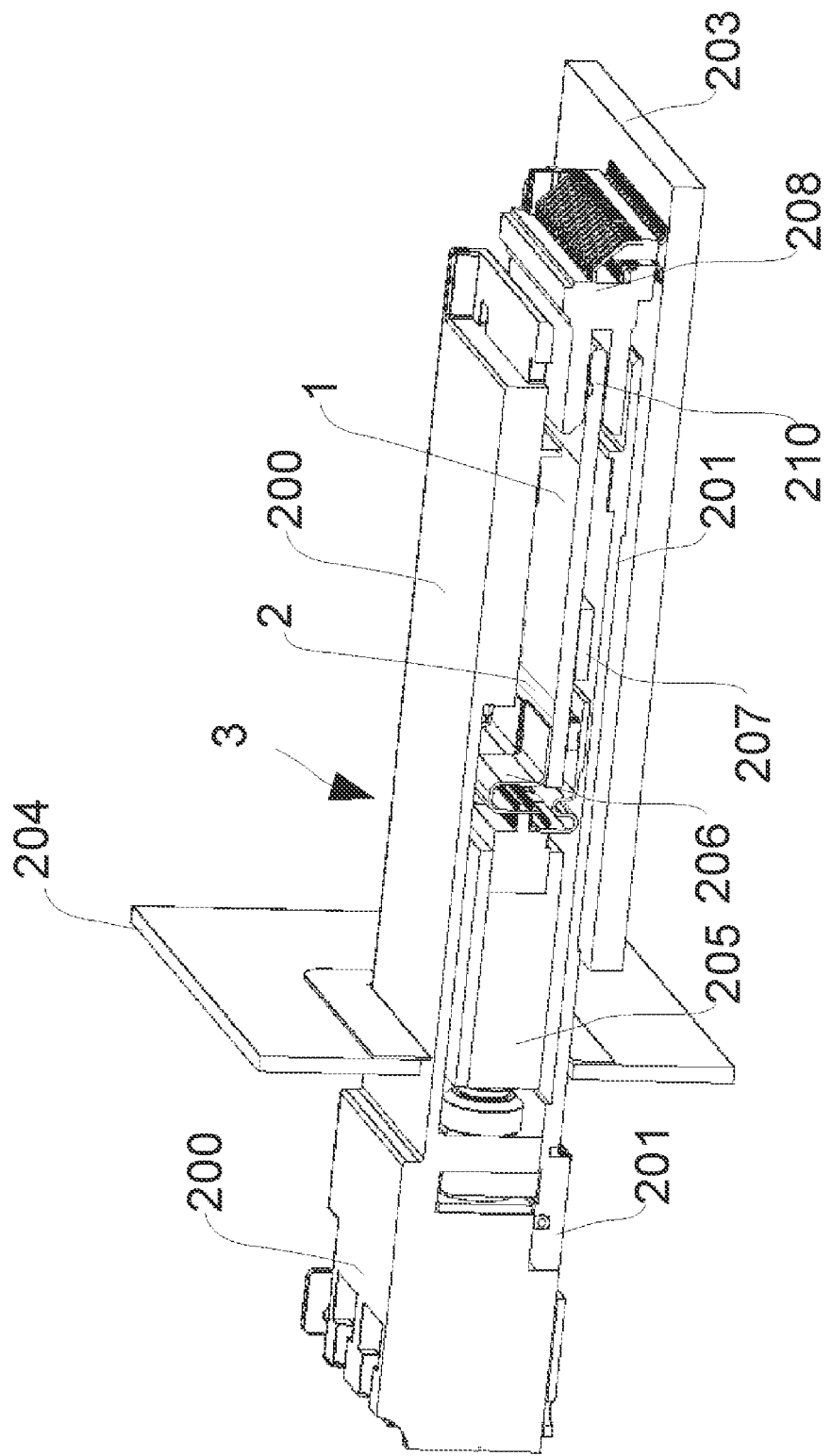
FIG. 1 schematically shows a perspective cross-sectional view of an optical transceiver comprising a printed circuit board according to a first embodiment of the invention, which is installed into a network device.

Like reference numerals designate the same or similar elements throughout all views so as to avoid any redundant description of the same or similar elements.

FIRST EMBODIMENT

Figure 2:
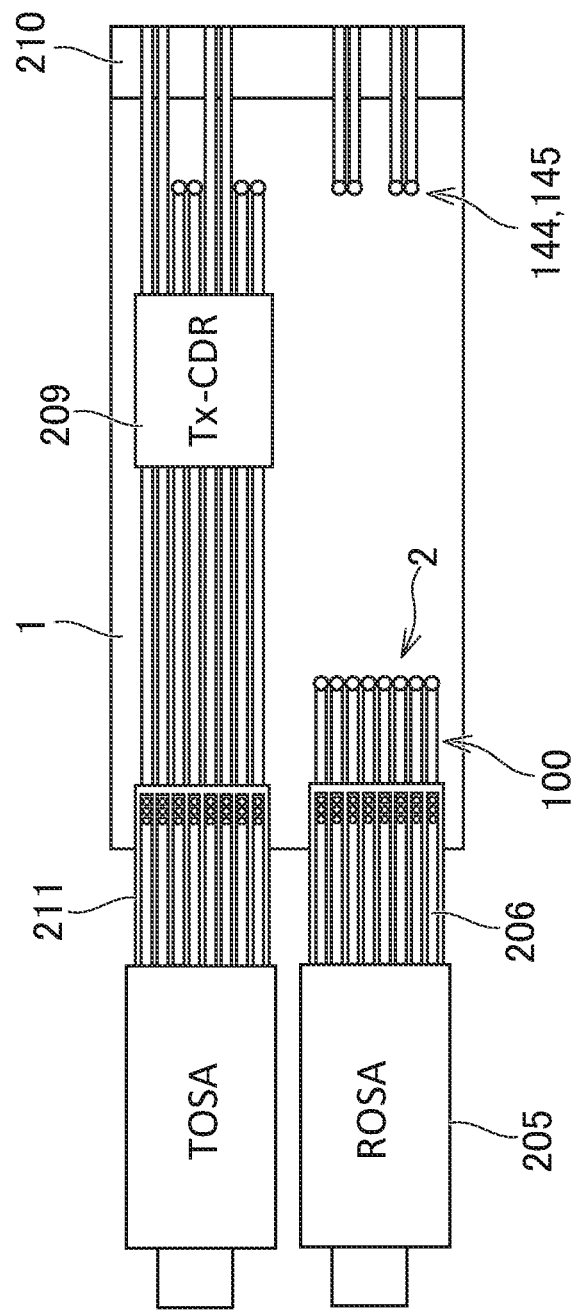
FIG. 2 shows a plan view of the printed circuit board according to the first embodiment of the invention.
Figure 3:
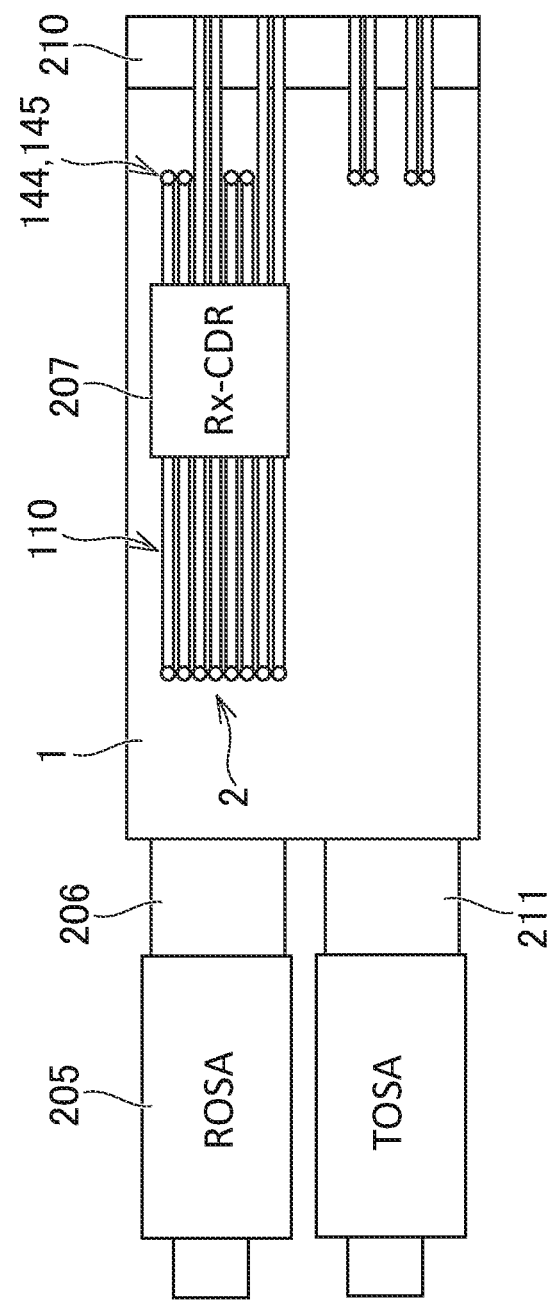
FIG. 3 shows a bottom view of the printed circuit board according to the first embodiment of the invention.

FIG. 1 schematically shows a perspective cross-sectional view of an optical transceiver comprising a printed circuit board according to a first embodiment of the invention, which is installed into a network device (not shown in the Figure). FIG. 2 shows the first surface of the printed circuit board according to the first embodiment. FIG. 3 shows the second surface of the printed circuit board according to the first embodiment. It is noted that only a receiver CDR IC (Rx CDR IC) 207 and a transmitter CDR IC (Tx CDR IC) 209 are illustrated in FIGS. 2 and 3 so as to avoid obscuring the gist of the present invention.

An optical transceiver 3 is inserted into an opening on a front panel 204 of the network device. The optical transceiver 3 is mounted on a printed circuit board 203 of the network device. A connector 208 is disposed on the printed circuit board 203 of the network device. A card edge 210 mate with the connector 208. The card edge 210 is exposed from a slot opening formed at a rear part of a housing consisting of an upper housing member 200 and a lower housing member 201.

The optical transceiver 3 comprises a printed circuit board (PCB) 1, the upper housing member 200, the lower housing member 201, a receiver optical subassembly (ROSA) 205, a transmitter optical subassembly (TOSA) (not shown in the Figure), a first flexible printed circuit (FPC) 206 connected to the ROSA, a second FPC 211 connected to the TOSA, a CDR IC 207, and the card edge 210. The upper and lower housing members 200 and 201 are tightly fit except the slot opening so as to form the housing of the optical transceiver 3. The ROSA 205, the TOSA, the first and second FPCs 206,211 and the PCB 1 etc are stored in the housing of the optical transceiver 3. The ROSA 205 and the TOSA are connected to the PCB 1 via the first and second FPCs 206,211. The card edge 210 is a wiring pattern disposed on one end of the printed circuit board 1. An array of contact terminals for the connector 208 is disposed on the card edge 210. Four pairs of differential transmission lines are arranged on the first FPC 206. Several ICs including the CDR IC 207 are mounted on the PCB 1.

The housing of the optical transceiver 3 covers the PCB 1 on which electronic components are mounted to function as an electromagnetic shield. The upper and lower housing members 200 and 201 may consist of metal such as Zn, Al. The card edge 210 is capable of performing a hotswap function. The connector 208 conforms to the QSFP28 MSA. The ROSA 205 converts four channels of optical input signals into electrical signals, and then amplifies the electrical signals to output four channels of digitally modulated differential signals at a bit rate of 25.78 Gbit/s to external terminals.

The PCB 1 according to the first embodiment encompasses both one comprising one or more dielectric layers having a wiring pattern on and in the one or more dielectric layers, and one comprising a multilayered structure consisting of dielectric sublayers. Throughout the present disclosure, the term "in the one or more dielectric layers" means a space inside of one dielectric layer or a space between two dielectric layers. The dielectric layer encompasses a single dielectric layer and a plurality of dielectric layers. As shown in FIG. 2, the first FPC 206, the second FPC 211, an array of differential signal vias 2, first differential transmission lines 100, differential signal vias 144,145 and a Tx-CDR IC 209 are disposed on the first surface of the PCB 1. As shown in FIG. 3, the array of differential signal vias 2, second differential transmission lines 110, the differential signal vias 144, 145 and the Rx-CDR IC 207 are disposed on the second surface of the PCB 1. The first differential transmission lines 100 on the first surface are connected to the second differential transmission lines 110 on the second surface via the array of differential signal vias 2. In FIGS. 2-3, the first and second differential transmission lines 100, 110 form four channels, respectively.

The external terminals of the ROSA 205 are connected to the first differential transmission lines 100 on the first surface of the PCB 1 via the FPC 206, on which third differential transmission lines are formed. The first differential transmission lines 100 are connected to the second differential transmission lines 110 on the second surface via the array of differential signal vias 2. The second differential transmission lines 110 on the second surface are connected to the Rx-CDR IC 207 on the second surface. Although four channels of differential transmission lines are illustrated in FIGS. 2-3, any plural number of channels other than four is contemplated.

The Rx-CDR IC 207 is connected to the differential transmission lines which form the four channels. Two-channel equivalent numbers of differential transmission lines are connected, via the differential signal vias 144,145, to corresponding two-channel equivalent numbers of differential transmission lines on the first surface, which are connected to the card edge 210.

Similar to the ROSA, the TOSA is connected to the first surface of the PCB 1 via the second FPC 211. The TOSA is connected to the Tx-CDR 209 via the differential transmission lines on the first surface of the PCB 1. The Tx-CDR 209 is connected to the card edge 210 via the two channels on the first surface and the rest two channels on the second surface.

Figure 4:
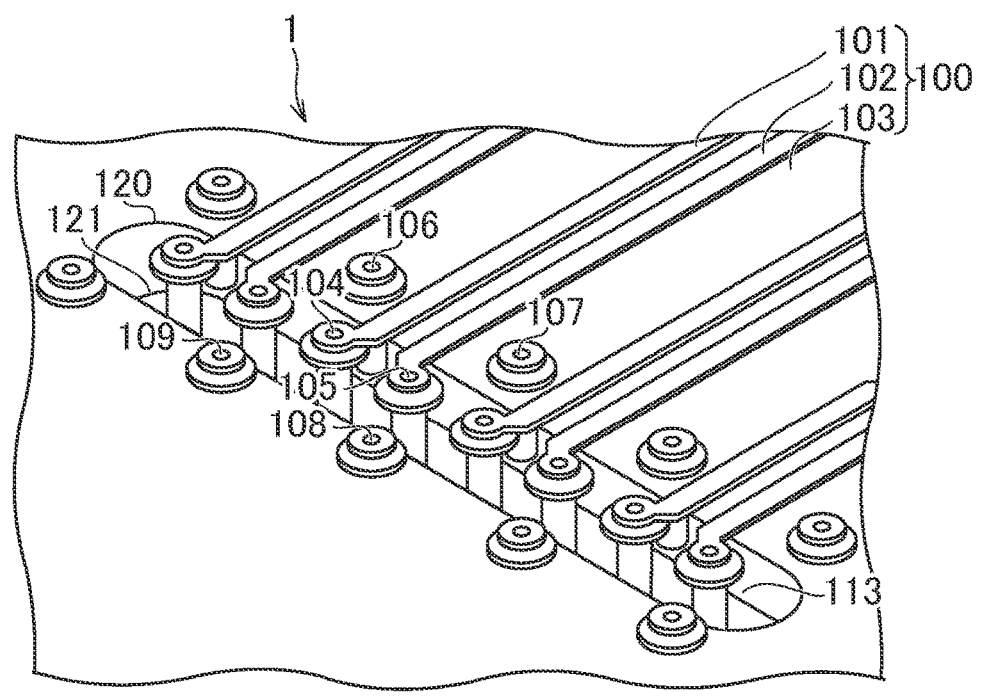
FIG. 4 shows a perspective view of four channels of differential signal vias on the printed circuit board according to the first embodiment of the invention.
Figure 5:
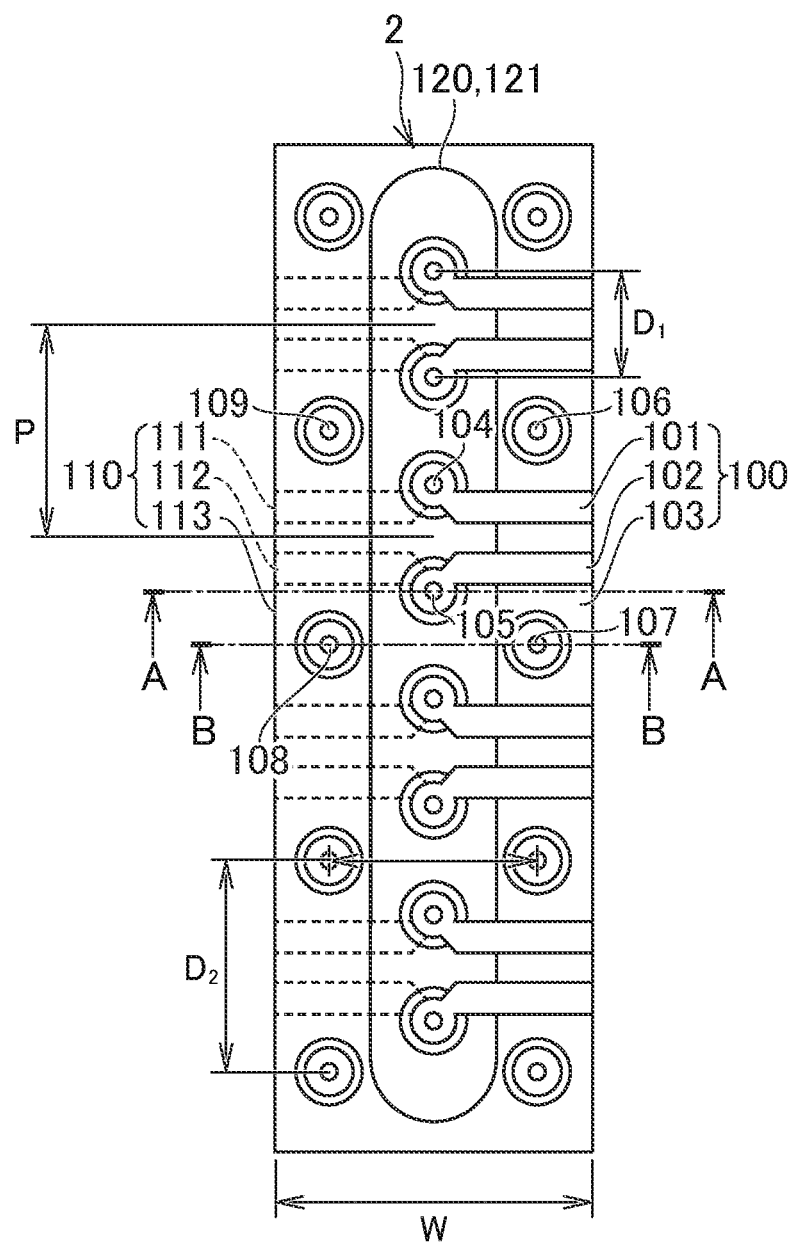
FIG. 5 shows a plan view of four channels of differential signal vias on the printed circuit board according to the first embodiment of the invention.
Figure 6:
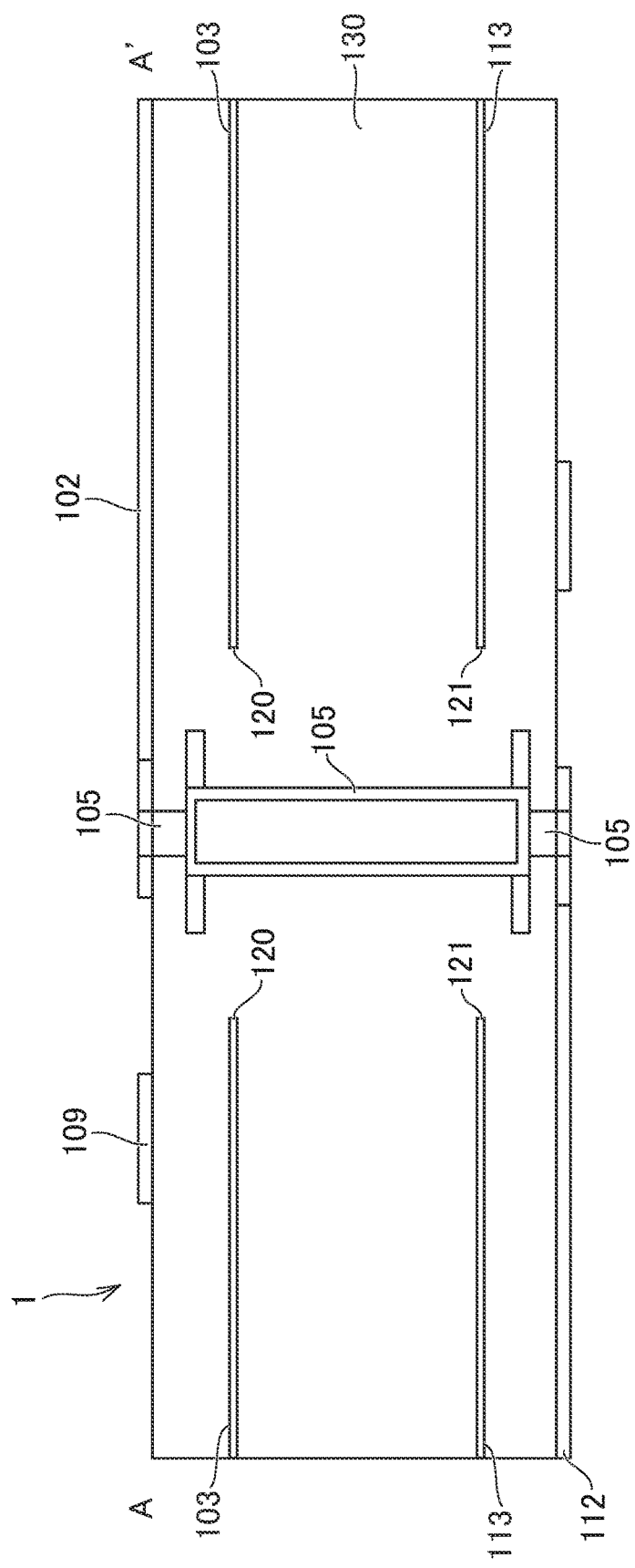
FIG. 6 shows a schematic cross-sectional view of the printed circuit board according to the first embodiment of the invention along the A-A line.
Figure 7:
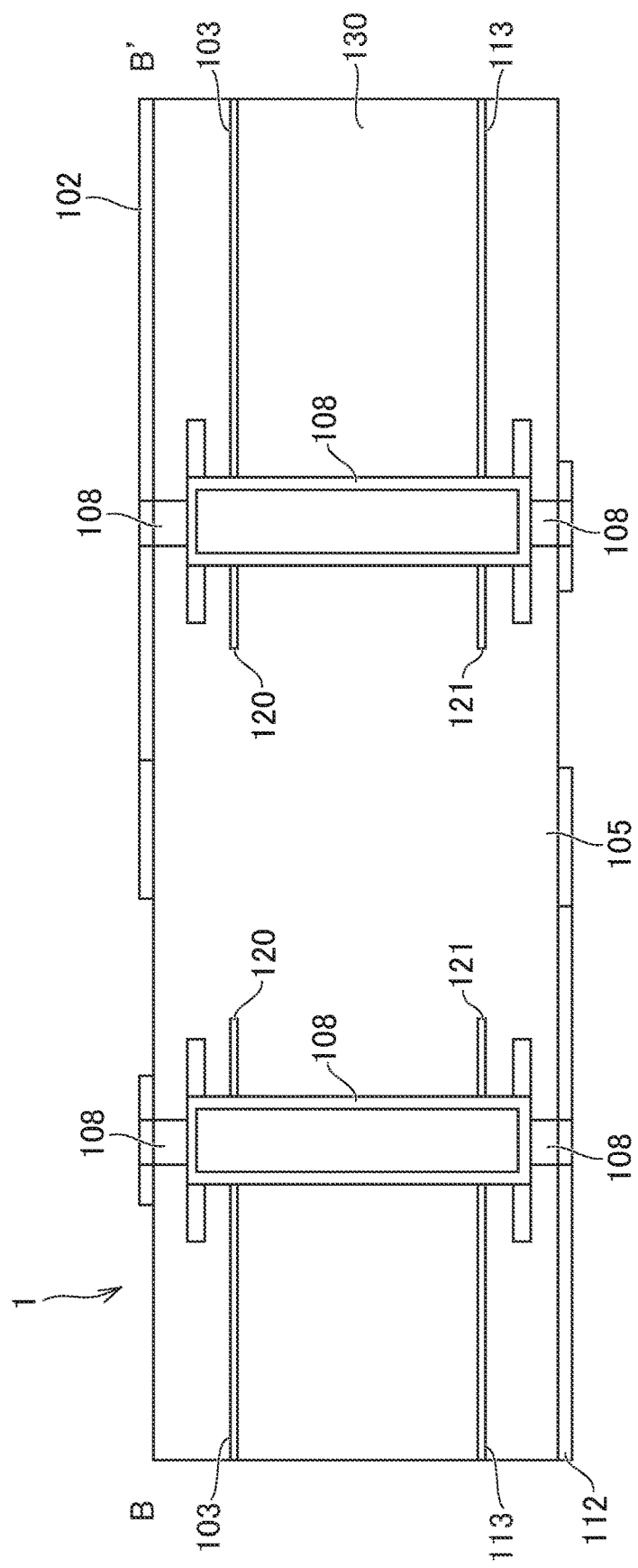
FIG. 7 shows a schematic cross-sectional view of the printed circuit board according to the first embodiment of the invention along the B-B line.

FIG. 4 shows a perspective view of the four channels of the array of differential signal vias 2 on the printed circuit board according to the first embodiment. FIG. 5 shows a plan view of the four channels of the array of differential signal vias on the printed circuit board according to the first embodiment. FIG. 6 shows a schematic cross-sectional view of the printed circuit board according to the first embodiment along the A-A line. FIG. 7 shows a schematic cross-sectional view of the printed circuit board according to the first embodiment along the B-B line.

As shown in FIG. 4, the array of differential signal vias 2 consists of four pairs of the differential signal vias, ten ground conductor vias, and two ground conductor layers 103, 113 connected to the ten ground conductor vias with the respective openings 120,121. The four pairs of the differential signal vias are disposed in the openings 120,121. The array of the differential signal vias 2 is connected to the four pairs of the first differential transmission lines 100 on the first surface, and connected to the four pairs of the second differential transmission lines 110 on the second surface. In FIGS. 4-7, the four channels are formed. For example, the four channels are arranged between the ROSA and the Rx CDR IC to transmit serial data at a rate of 4×25.78 Gbit/s as electrical signals.

For providing better understanding of the channel structure, the illustrated four channels will be described (hereinafter, referred to as first, second, third and fourth channels from left to right). Specifically, the second channel will be described consisting of the differential signal vias 104, 105. It is noted that the four channels have the same structure including dimensions of the four channels near the differential signal vias. The differential signal vias 104, 105 form a pair of the differential signal vias. The differential signal vias 104, 105 connect a surface wiring on the first surface (a first pair of strip conductors) to a surface wiring on the second surface (a second pair of strip conductors). $D_1$ represents a center-to-center distance between the differential signal vias 104, 105 (a pitch of differential signal vias). In the first embodiment, $D_1$ is 0.7 mm, however, any other value is contemplated. In the first embodiment, the differential signal vias 104,105 may be in the form of both the IVH (interstitial via hole) and LVH (laser via hole), which can be fabricated by drill processing and laser processing, respectively. However, the differential signal vias 104,105 may be fabricated by various methods depending on production processes of the multilayered PCB 1. In the first embodiment, the vias (via holes) may be formed by: opening IVHs, each having a diameter of 0.2 mm; cupper plating inner surfaces of the IVHs; opening LVHs, each having a diameter of 0.1 mm; and cupper plating inner surfaces of the LVHs.

The first differential transmission lines 100 on the first surface consists of a pair of strip conductors 101,102 (a first pair of strip conductors) on the surface of the PCB 1 and the ground conductor layer 103 in the dielectric layer 130. The strip conductors 101,102 and ground conductor layer 103 may be formed by patterning a cupper foil. The first differential transmission lines 100 are microstrip lines. The width of each of the strip conductors 101,102 and the distance between the strip conductors 101,102 are determined such that the first differential transmission lines 100 have the respective characteristic differential impedance of 100Ω. For example, if the dielectric layer has a dielectric constant of 3.5 and the interlayer distance between the strip conductors 101,102 and the ground conductor layer 103 is 0.166 mm, it is preferable to set the width of each of the strip conductors 101,102 and the distance between the strip conductors 101,102 0.19 mm and 0.20 mm, respectively. In FIGS. 4-7, four pairs of the first strip conductors are arranged (Four channels of the first differential transmission lines are formed).

Compound material of glass fabric and epoxy resin (glass epoxy resin) can be used for the dielectric layer 130 as a substrate of the PCB 1. In the first embodiment, the PCB 1 has a thickness of 1.0 mm, however, other thicknesses are contemplated.

The second differential transmission lines 110 on the second surface, opposite of the first surface, of the PCB 1 consists of strip conductors 111,112 (a second pair of strip conductors) on the second surface, and the ground conductor layer 113 in the dielectric layer. Similar to the first differential transmission lines 100, the strip conductors 111,112 may be dimensioned such that the second differential transmission lines 110 have the respective characteristic differential impedance of 100Ω, for example.

Four ground conductor vias 106,107,108,109 are arranged around the pair of the differential signal vias 104,105 such that the four ground conductor vias 106,107,108,109 form a rectangle seen from the top. $D_2$ represents a center-to-center distance between the ground conductor vias 106,107. P represents a center-to-center distance between neighboring differential signal vias of the neighboring channels. $D_2$ may be same as P. In the first embodiment, $D_2$ is 1.4 mm. In the first embodiment, a center-to-center distance between the ground conductor vias 107,108 is 1.4 mm, however, other values are contemplated.

The openings (antipads) 120,121 are disposed in the ground conductor layers 103,113 to insulate the ground conductor layers 103,113 from the differential signal vias, respectively. All neighboring differential signal vias of the first, second, third, and fourth channels are disposed so as to penetrate through the openings 120,121. All differential signal vias are arranged along one direction seen from the top, forming the pairs of the differential signal vias of the first, second, third, and fourth channels. Preferably, all differential signal vias are arranged along one line.

The differential signal vias of the first, second, third, and fourth channels are arranged such that the ten ground conductor vias surround the four pairs of the differential signal vias. Two of the ten ground conductor vias are arranged between the neighboring differential signal vias so as to face each other across the openings. That is, the neighboring differential signal vias shares the two ground conductor vias. For example, the ground conductor vias 107,108 are disposed between the pairs of the differential signal vias of the second and the third channels, and the pairs of the differential signal vias of the second and the third channels share the ground conductor vias 107,108. In the first embodiment, the ten ground conductor vias are deployed for the four pairs of the differential signal vias. The ten ground conductor vias are connected the ground conductor layers 103,113 outside the openings 120,121. The ground conductor vias is arranged around corresponding differential signal vias to suppress a degree of spread of electromagnetic fields of the corresponding differential signal vias, thereby reducing an amount of crosstalk of the neighboring channels.

The first embodiment can reduce an area occupied by the array of the differential signal vias 2. In the first embodiment, a center-to-center distance of each paired differential signal vias of the first, second, third and fourth channels (a pitch of differential signal vias), $D_1$, is 0.7 mm. In the first embodiment, a center-to-center distance of each paired differential signal vias between the neighboring channels (a channel pitch), P, is all 1.4 mm. In the first embodiment, a size of the array of the differential signal vias 2 is approximately 2.0 mm×6.2 mm.

Figure 8:
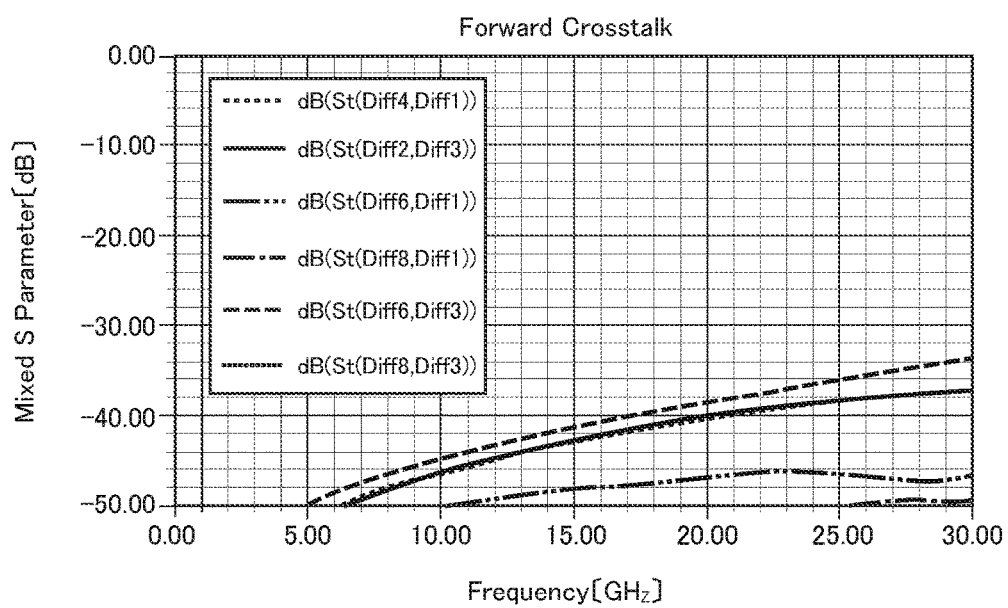
FIG. 8 shows a graph of a forward crosstalk property between the four channels at differential signal vias according to the first embodiment of the invention.

FIG. 8 shows a graph of a forward crosstalk property between the four channels at the differential signal vias according to the first embodiment. In the four channels of the array of the differential signal vias according to the first embodiment, the first channel consists of differential ports 1,2; the second channel consists of differential ports 3,4; the third channel consists of differential ports 5,6; and the fourth channel consists of differential ports 7,8. In FIG. 8, St(Diff4, Diff1) represents forward crosstalk to enter the differential port 1 and to be detected at the differential port 4; St(Diff2, Diff3) represents forward crosstalk to enter the differential port 3 and to be detected at the differential port 2; St(Diff6, Diff1) represents forward crosstalk to enter the differential port 1 and to be detected at the differential port 6; St(Diff8, Diff1) represents forward crosstalk to enter the differential port 1 and to be detected at the differential port 8; St(Diff6, Diff3) represents forward crosstalk to enter the differential port 3 and to be detected at the differential port 6; and St(Diff8,Diff3) represents forward crosstalk to enter the differential port 3 and to be detected at the differential port 8.

Due to symmetry of the four channels (eight ports) of the differential signal vias, the forward crosstalk property of the four channels of the differential signal vias can be characterized through examination of six patterns of the forward crosstalk.

Frequency-dependence of the forward crosstalk property is obtained through three-dimensional electromagnetic field analysis. The result of the analysis demonstrates that the forward crosstalk property is kept to at most −36 dB, and thus that the array of the differential signal vias with very low crosstalk is realized.

SECOND EMBODIMENT

Figure 9A:
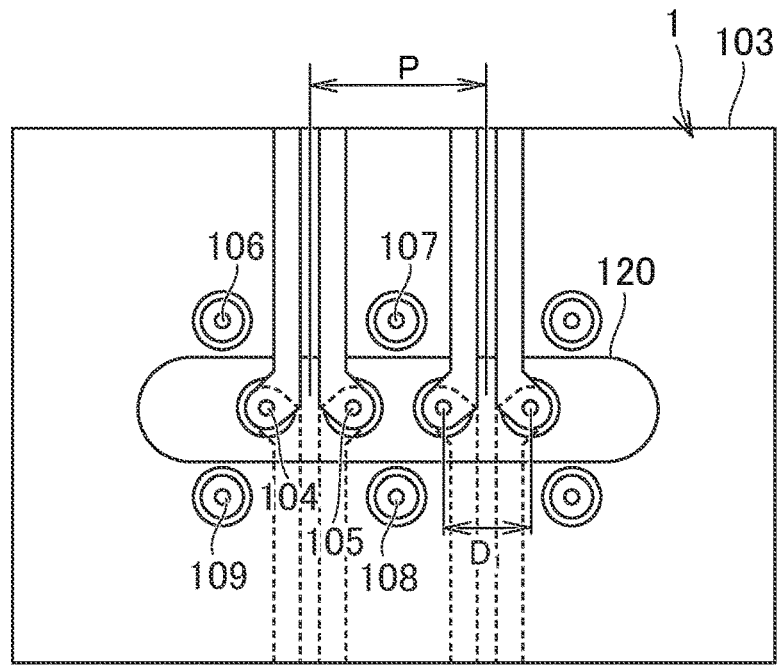
FIG. 9A shows an expanded plan view of two channels of differential signal vias on a second embodiment of a printed circuit board of the invention.
Figure 9B:
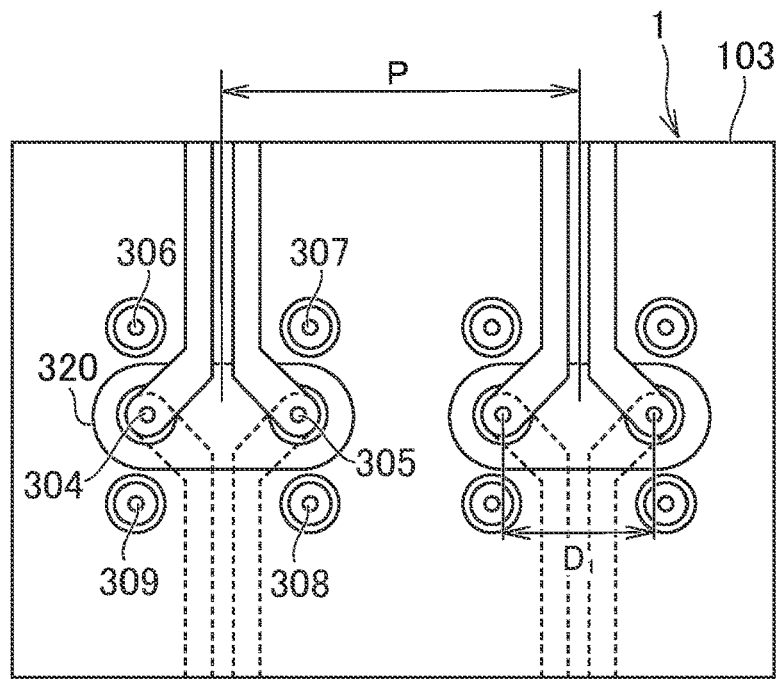
FIG. 9B shows an expanded plan view of two channels of differential signal vias on a printed circuit board of a comparative example 1.

FIG. 9A shows an expanded plan view of two channels of an array of differential signal vias on a second embodiment of a printed circuit board. FIG. 9B shows an expanded plan view of two channels of differential signal vias on a printed circuit board of a comparative example 1. The second embodiment is similar to the first embodiment except the number of channels of the differential transmission lines.

As shown in FIG. 9A, the array of the differential signal vias consists of two pairs of the differential signal vias, six ground conductor vias and two layers of ground conductor connected to the six ground conductor vias with an opening 120, referred to as an antipad. All differential signal vias of the first and second channels neighboring each other are disposed in the opening 120 through the printed circuit board. All differential signal vias of the first and second channels are arranged along one direction seen from the top. Preferably, all differential signal vias are arranged on one line. In FIG. 9A, the six ground conductor vias are arranged around the first and second channels. Two of the six ground conductor vias are arranged between each pair of the differential signal vias of the first and second channels so as to face each other across the opening 120. Specifically, the ground conductor vias 107,108 are arranged between the first and second channels of the differential signal vias neighboring each other so as to face each other across the opening 120. In other words, the four ground conductor vias are arranged around each pair of the differential signal vias, and the differential signal vias of the first and second channels share the ground conductor vias 107,108. The six ground conductor vias are connected the ground conductor layer 103 outside the openings 120.

The left channel of the two channels will be described (referred to as the first channel) for the purpose of illustrating the channel structure not limitation. The four ground conductor vias 106, 107, 108 and 109 are arranged around the pair of the differential signal vias of the differential signal vias 104,105 so as to form a rectangle seen from the top. A center-to-center distance of the ground conductor vias 106, 107 is set so as to be equal to a center-to-center distance, P, of the differential signal vias between the neighboring channels. In the first embodiment, the center-to-center distance of the ground conductor vias 107,108 is 1.4 mm, however other values are contemplated. It is noted that the structure of the second channel is same as that of the first channel including the dimensions of the first and second channels.

The center-to-center distance (signal via pitch), $D_1$, between the differential signal vias of each pair of the first and second channels is determined to be within the below-mentioned range of values so as to set $D_1$ in the first channel equal to $D_1$ in the second channel. For example, $D_1$ is preferably 0.7 mm. The center-to-center distance (channel via pitch), P, between the differential signal vias of each of the first and second channels is determined to be within the below-mentioned range of values. For example, P is preferably 1.4 mm, however, other values are contemplated. Such arrangement of the differential signal vias can significantly reduce an area occupied by the differential signal vias.

FIG. 9B shows a comparative example 1 in order to compare the second embodiment with the comparative example 1. There are two differences between the second embodiment and the comparative example 1. A first difference is that eight ground conductor vias are arranged around two pairs of differential signal vias. That is, four ground conductor vias are disposed between neighboring pairs of the differential vias, and thus the neighboring pairs share none of the eight ground conductor vias. As shown in FIG. 9B, the four ground conductor vias 306,207,308,309 are arranged around the pair of the two differential signal vias 304,305. The next set of the four ground conductor vias and the pair of the two differential signal vias is arranged similarly. A second difference is that each pair is arranged to penetrate through each respective antipad (opening). As shown in FIG. 9B, only one pair of the differential signal vias penetrates through the opening 320 to connect one differential transmission line (one pair of strip conductors). The next set of the four ground conductor vias and the pair of the two differential signal vias is arranged similarly. In the second embodiment, the center-to-center distance between the ground conductor vias 106,107 is set to 1.4 mm, and the center-to-center distance between the ground conductor vias 107,108 is set to 1.4 mm. In the comparative example 1, the center-to-center distance, $D_1$, between the differential signal vias 304,305 is set to 1.2 mm, and the distance (channel pitch),P, between the centers of the respective paired differential signal vias in the first and second channels is set to 2.8 mm.

Figure 10:
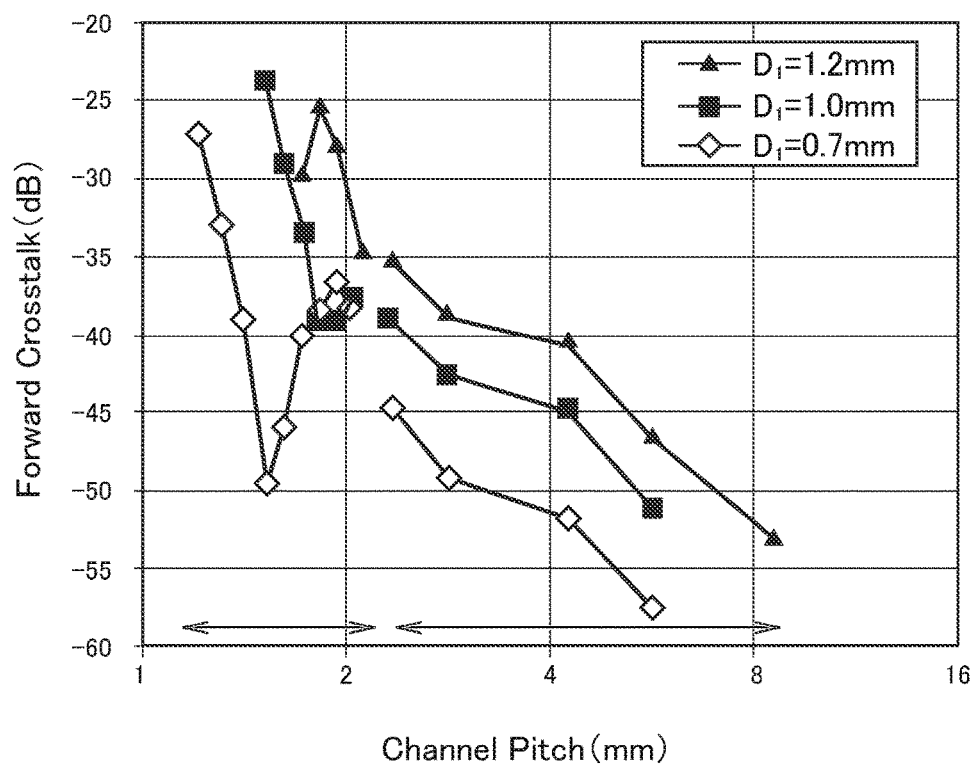
FIG. 10 shows the forward crosstalk (maximum amount) between the two channels as a function of a channel pitch (P) at differential signal vias of the second embodiment of the printed circuit board compared with the comparative example 1.

FIG. 10 shows the forward crosstalk (maximum amount) between the two channels as a function of a channel pitch (P) at the differential signal vias of the second embodiment of the printed circuit board compared with the comparative example 1. The vertical axis represents the maximum amount of the forward crosstalk ranging from 0 to 25 GHz. The horizontal axis represents the channel pitch P. The maximum amount of the forward crosstalk in FIG. 10 is one obtained near the differential signal vias shown in FIG. 5. Specifically, the maximum value is obtained by obtaining a set of S-parameters of the differential signal lines and the differential signal vias, subtracting the set of S-parameters from contribution of the microstrip lines, and performing a matrix operation of the set of S-parameters.

FIG. 10 shows six curves of the forward crosstalk as a function of a channel pitch, P, where the differential via pitch, $D_1$, is set to 1.2 mm, 1.0 mm, and 0.7 mm, respectively. The second embodiment corresponds to where P is equal or less than 2.1 mm while the comparative example 1 corresponds to where P is equal or more than 2.3 mm.

The present inventor observed that an amount of the forward crosstalk monotonically increases with decreasing of a channel pitch P, and, reaches the maximum value at a channel pitch P of 2.3 mm, which is the minimum size, in the printed circuit board of the comparative example 1. It is known that such behavior of the forward crosstalk of the differential signal vias depends mainly on the capacitive coupling of the differential signal vias rather than the change of the differential signal vias.

Setting the differential via pitch, $D_1$, 1.2 mm facilitates a characteristic impedance at the differential signal vias to match with 100Ω, which is ideal for maintaining a good transmission property. In the comparative example 1, setting the differential via pitch, $D_1$, and the channel pitch, P, 1.2 mm and 2.8 mm, respectively, allows the maximum value of the forward crosstalk to be −38 dB, and thus to maintain a good transmission property. However, the present inventor has found it difficult to significantly reduce a width of the channel pitch, P, to realize further high-density implementation of the printed circuit board.

In the second embodiment, although a technically feasible size of a minimum channel pitch, P, depends on a pitch between differential signal vias, P can be smaller than 2.1 mm. If a pitch, $D_1$, between differential signal vias is 1.2 mm, an amount of the forward crosstalk drastically increases with decreasing a channel pitch P. On the other hands, the present inventor has found that the amount of the forward crosstalk reaches the local minimum, and then increases if a channel pitch P decreases from 2.1 mm. This region, for example where a channel pitch P is 1.2 mm, shows that a coupling between differential signal vias is inductive. It can be seen from FIG. 10 that the coupling between differential signal vias is changed from capacitive to inductive one at a region where a channel pitch P is 1.5 mm, which is near the local minimum. In other words, the coupling between differential signal vias transitions capacitive to inductive one at a region where P is near 1.5 mm. Thus, the capacitive coupling is expected to be offset by the inductive coupling in this transition region. Where a pitch, $D_1$, between differential signal vias, is 0.7 mm, a parasitic capacitance at the differential signal vias decreases, thereby decreasing differential reflection property to about −20 dB, and maintaining a good transmission property. As described above, the second embodiment maintains the maximum value of the amount of the forward crosstalk at −39 dB, and thus a good transmission property if a pitch, $D_1$, between differential signal vias is reduced to 0.7 mm, and a channel pitch P is reduced to 1.4 mm.

Figure 11:
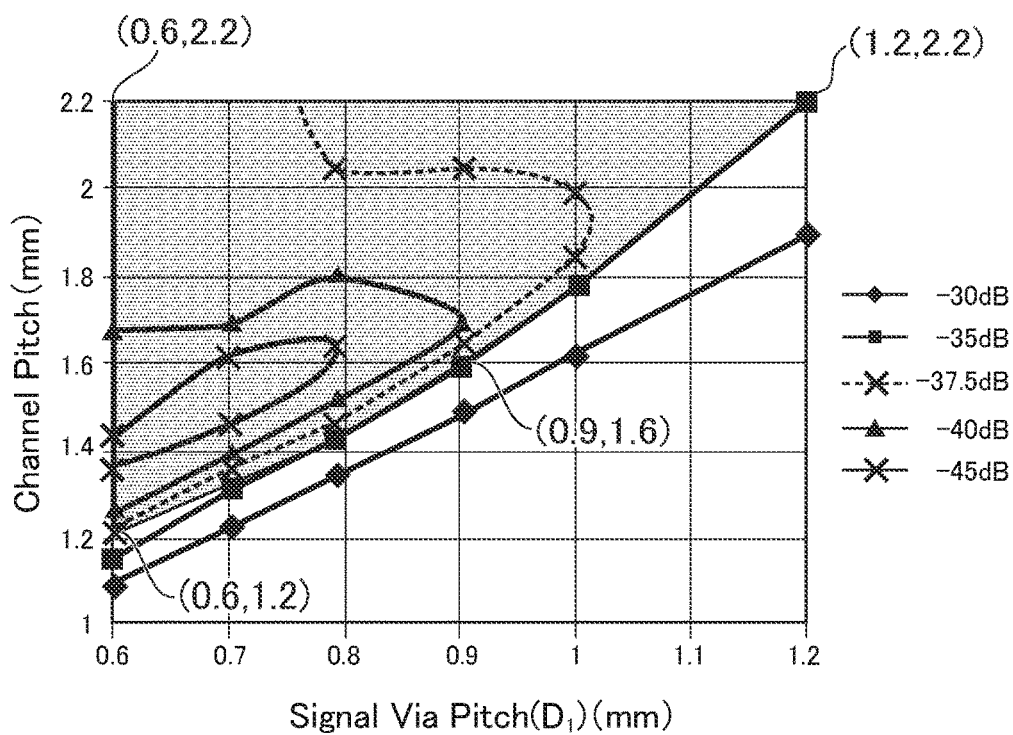
FIG. 11 shows isoplethic lines of (maximum) amounts of the forward crosstalk between the two channels as a function of the channel pitch (P) and a via pitch ($D_1$) at differential signal vias of the second embodiment of the printed circuit board.

Then, a pitch, $D_1$, between differential signal vias and a channel pitch P will be described, which realize the above-mentioned mechanism of the offset, and thus reduction of the amount of the forward crosstalk in the second embodiment. FIG. 11 shows isoplethic lines of (maximum) amount of the forward crosstalk between the two channels as a function of the channel pitch (P) and a via pitch ($D_1$) at the differential signal vias of the second embodiment. The amount (maximum value) of the forward crosstalk is obtained through three-dimensional electromagnetic field analysis when a pitch, $D_1$, between differential signal vias changed from 0.6 mm to 1.2 mm, and a channel pitch, P, is changed from 1.0 mm to 0.2 mm. In FIG. 11, the amount (maximum value) of the forward crosstalk is expressed by isoplethic lines with an x-axis representing the pitch, $D_1$, and a y-axis representing the channel pitch, P.

It follows from FIG. 11 that a significant effect can be obtained in a relatively large area centered at (0.7 mm, 1.5 mm), in which the maximum value of the forward crosstalk can be suppressed at most −45 dB. Whether the maximum amount of the forward crosstalk is acceptable depends on a network apparatus comprising an optical transceiver or system specification. The maximum amount is acceptable, having a value equal or less than −35 dB. It can be seen from FIG. 11 that, where $D_1$ represents a center-to-center distance between two neighboring pairs of differential signal vias, and P represents a center-to-center distance between the two neighboring pairs, ($D_1$,P) lies within a quadrangle having the following apexes: (0.6 mm,1.2 mm), (0.9 mm,1.6 mm), (1.2 mm,2.2 mm) and (0.6 mm, 2.2 mm), which realizes a desired property in the second embodiment. It is noted that the desired property can be realized regardless of the number of channels in the second embodiment. In other words, even for pairs of differential signal vias connected to the four channels shown in the first embodiment, the channel pitch P and the pitch $D_1$ between differential signal vias may be selected such that the relationship described in FIG. 11 is satisfied, in accordance with the desired property.

As described above, according to the second embodiment, the optical transceiver comprising the printed circuit board, the FPC on the first surface of the printed circuit board, and the CDR IC on the second surface of the printed circuit board, reduces the amount of the forward crosstalk between the two channels from the ROSA to the Rx CDR IC, and also reduces the area occupied by the differential signal vias, thereby realizing the printed circuit board with higher-rate and higher-density implementation. As described in the comparative example 1, it is necessary to set the openings in the ground conductor layer apart from each other such that one pair of the differential signal vias is included in each opening in order to obtain the desired property. However, the present inventor has found that a good crosstalk property can be obtained even when the channel pitch P is smaller. As a result of the smaller channel pitch P, two neighboring pairs of differential signal vias can be disposed in a single opening in the ground conductor layer, and thus an area occupied by the array of differential signal vias can be significantly reduced. Furthermore, a good crosstalk property can be obtained even when neighboring channels share two ground conductor vias between the neighboring channels, and thus miniaturization can be realized. As a result of the smaller channel pitch P, the second embodiment can offer the printed circuit board which realizes miniaturization of the printed circuit board and ensures the integrity of the transmission waveform transmitted through the printed circuit board, and also offer the optical transceiver comprising the printed circuit board.

Although two channels of differential transmission lines and differential signal vias are arranged on the printed circuit board in the second embodiment, and four channels of differential transmission lines and differential signal vias are arranged on the printed circuit board in the first embodiment, the number of neighboring channels may be other than 2 or 4. Where the number of neighboring channels is N (wherein N is an integer equal to or more than two), (2N+2) ground conductor vias are arranged around N pairs of differential signal vias; two of the ground conductor vias are arranged between two of the neighboring channels so as to face each other across an opening in the ground conductor layer; the two neighboring channels share the two ground conductor vias; and the two ground conductor vias are connected to the ground conductor layer outside the opening.

Figure 12:
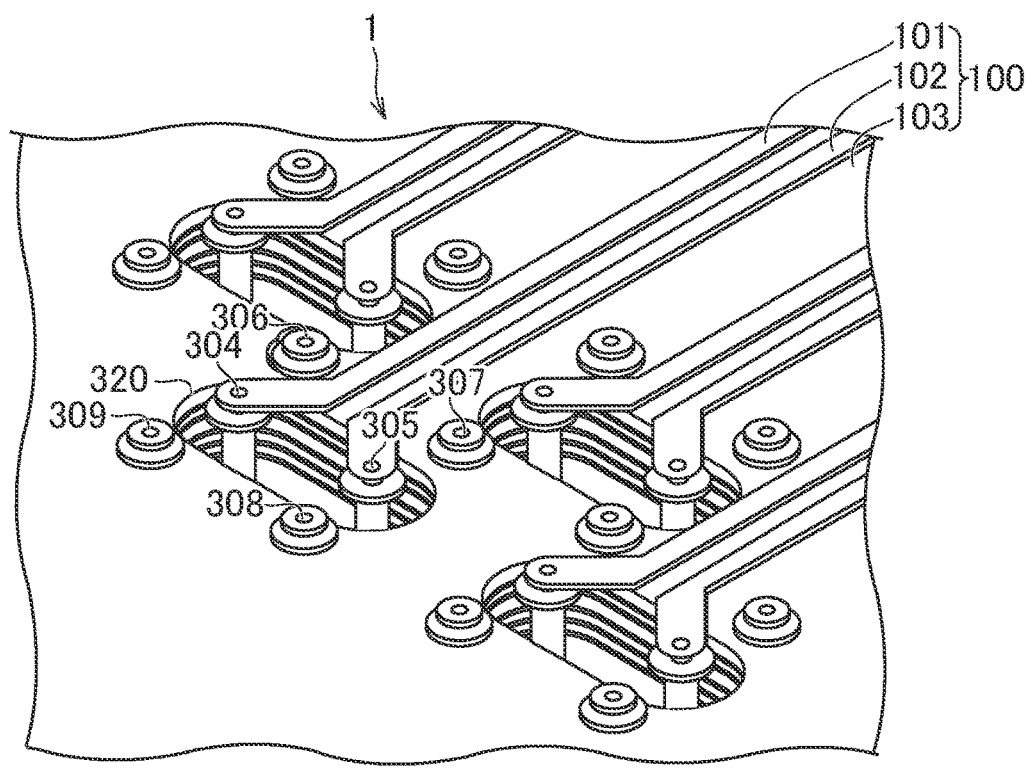
FIG. 12 shows a perspective view of four channels of differential transmission lines and differential signal vias on a printed circuit board of a comparative example 2.
Figure 13:
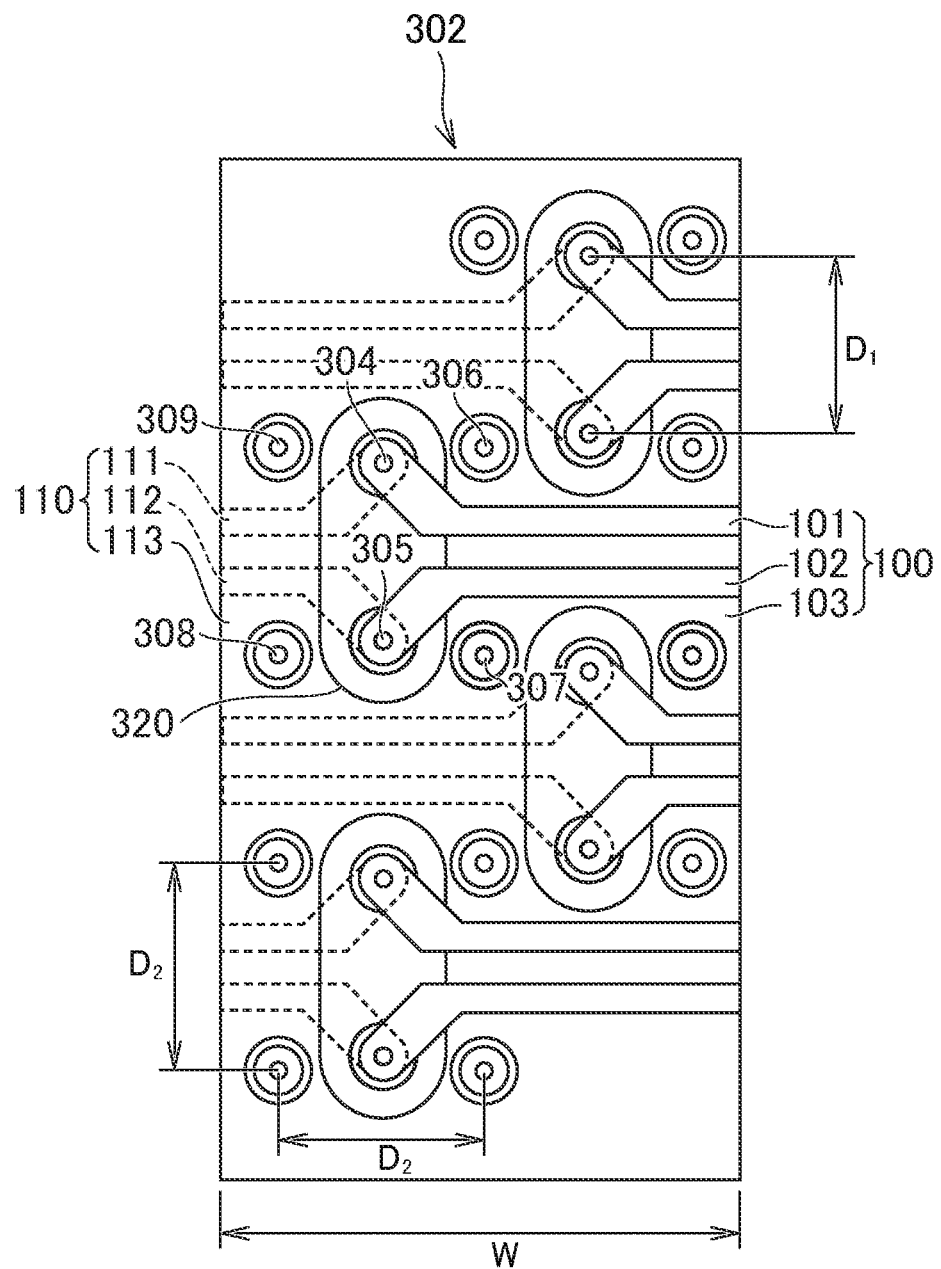
FIG. 13 shows a plan view of the four channels of differential signal vias on the printed circuit board of the comparative example 2.

In order to describe an effect of the embodiments, a comparative example 2 will be described with reference to FIGS. 12 and 13. FIG. 12 shows a perspective view of four channels of differential transmission lines and differential signal vias on a printed circuit board of a comparative example 2. FIG. 13 shows a plan view of the four channels of the differential signal vias on the printed circuit board of the comparative example 2.

The comparative example 2 comprises four channels of an array of differential signal vias aimed at arranging higher-density arrangement than two sets of the neighboring differential signal vias in the comparative example 1 in a higher density manner. In the comparative example 2, the two sets of the two neighboring differential signal vias of the two channels are arranged alternately, and two pairs share the respective three ground conductor vias. Such arrangement allows a channel pitch P perpendicular to the direction along which the differential transmission lines 100 extend to be 1.4 mm, which is equal to one in the first embodiment. The present inventor has examined six cases of forward crosstalk properties of four channels of the differential transmission lines. As a result of the examination, the forward crosstalk reached the maximum between the second and third channels, and between the first and fourth channels. The maximum is equal to one in the comparative example 1, indicating a good property can be obtained. However, a size of an array of the differential signal vias 302 is about 3.4 mm×6.2 mm, which is inferior to the first embodiment comprising the array of the differential signal vias 2 with a size of 2.0 mm×6.2 mm from the view point of reduction of area.

In summary, the first embodiment offers the printed circuit board which can reduce an area occupied by the array of the differential signal vias, and realizes higher-rate and higher-density implementation than the comparative example 2 intended for high-density implementation. Therefore, the first embodiment can offer the printed circuit board which realizes miniaturization of the printed circuit board and ensures the integrity of the transmission waveform transmitted through the printed circuit board, and also offer the optical transceiver comprising the printed circuit board.

The first and second embodiments have been described in conjunction with the differential transmission lines connected to the ROSA. However, the first and second embodiments are not limited to the differential transmission lines connected to the ROSA. The first and second embodiments may be applied to an array of differential signal vias which connect the first and second surfaces of the printed circuit board. In the first and second embodiments, the differential transmission lines are connected to the CDR IC. However, the present invention offer the same advantageous effects as the first and second embodiments even when the differential transmission lines are connected to other ICs, such as DSP (Digital Signal Processor).

While there have been described what are at present considered to be certain embodiments of the invention, it will be understood that various modifications may be made thereto, and it is intended that the appended claims cover all such modifications as fall within the true spirit and scope of the invention.

What is claimed is:

1. A printed circuit board comprising:
a dielectric layer; N pairs of differential signal vias which penetrate through the dielectric layer wherein N is an integer more than one;
N pairs of first strip conductors disposed on a first surface of the dielectric layer; a first ground conductor layer disposed in the dielectric layer forming N first differential transmission lines with the N pairs of first strip conductors and the dielectric layer;
N pairs of second strip conductors disposed on a second surface of the dielectric layer;
a second ground conductor layer disposed in the dielectric layer forming N of second differential transmission lines with the N pairs of second strip conductors and the dielectric layer, wherein the N pairs of first strip conductors and the N pairs of second strip conductors are connected to each other via the N pairs of differential signal vias; and
first and second ground conductor layers have first and second single openings to insulate the first and second ground conductor layers from the N pairs of differential signal vias, respectively, and
wherein the N pairs of differential signal vias penetrate through the first and second single openings and are arranged along one direction in the first and second single openings.

2. The printed circuit board according to claim 1, further comprising (2N+2) ground conductor vias arranged around each of the N pairs of differential signal vias, wherein two of the (2N+2) ground conductor vias are disposed between two neighboring pairs of the N pairs of differential signal vias, and face each other across the first and second single openings; and each of the (2N+2) ground conductor vias is connected to the first and second ground conductor layers outside the first and second single openings.

3. The printed circuit board according to claim 1, where $D_1$ represents a center-to-center distance between two neighboring pairs of differential signal vias of the N pairs of differential signal vias; and P represents a center-to-center distance between two neighboring ones of the first differential transmission lines connected to the two neighboring pairs of differential signal vias, $(D_1,P)$ lies within a quadrangle having the following apexes: (0.6 mm, 1.2 mm), (0.9 mm, 1.6 mm), (1.2 mm, 2.2 mm) and (0.6 mm, 2.2 mm).

4. A printed circuit board comprising:
a dielectric layer; N pairs of differential signal vias which penetrate through the dielectric layer wherein N is an integer more than one;
N pairs of first strip conductors disposed on a first surface of the dielectric layer; a first ground conductor layer disposed in the dielectric layer forming N of first differential transmission lines with the N pairs of first strip conductors and the dielectric layer;
N pairs of second strip conductors disposed on a second surface of the dielectric layer; and
a second ground conductor layer disposed in the dielectric layer forming N of second differential transmission lines with the N pairs of second strip conductors and the dielectric layer,
wherein the N pairs of first strip conductors and the N pairs of second strip conductors are connected to each other via the N pairs of differential signal vias; and
where $D_1$ represents a center-to-center distance between two neighboring pairs of differential signal vias of the N pairs of differential signal vias; P represents a center-to-center distance between two neighboring ones of the first differential transmission lines connected to the two neighboring pairs of differential signal vias, ($D_1$, P) lies within a quadrangle having the following apexes: (0.6 mm, 1.2 mm), (0.9 mm, 1.6 mm), (1.2 mm, 2.2 mm) and (0.6 mm, 2.2 mm).

5. The printed circuit board according to claim 4, wherein the first and second ground conductor layers have the first and second single openings to insulate the first and second ground conductor layers from the N pairs of differential signal vias, respectively; and the N pairs of differential signal vias penetrate through the first and second single openings and are arranged along one direction in the first and second single openings.

6. The printed circuit board according to claim 4, further comprising (2N+2) ground conductor vias arranged around each of the N pairs of differential signal vias, wherein two of the (2N+2) ground conductor vias are disposed between two neighboring pairs of the N pairs of differential signal vias, and face each other across the first and second single openings; and each of the (2N+2) ground conductor vias is connected to the first and second ground conductor layers outside the first and second single openings.

7. An optical transceiver comprising the printed circuit board according to claim 1.

8. The optical transceiver according to claim 7, further comprising:
an optical transmitter subassembly configured to output an optical signal;
an optical receiver subassembly configured to receive the optical signal and then convert the optical signal to an electrical signal;
a flexible printed circuit having N third differential transmission lines formed on the flexible printed circuit;
an integrated circuit (IC); and
a housing accommodating the printed circuit board, the optical receiver subassembly, the flexible printed circuit, and the IC, wherein the electrical signal is connected to the first differential transmission lines of the printed circuit board via the third differential transmission lines of the flexible printed circuit.

9. An optical transceiver comprising the printed circuit board according to claim 4.

10. The optical transceiver according to claim 9, further comprising:
an optical transmitter subassembly configured to output an optical signal;
an optical receiver subassembly configured to receive the optical signal and then convert the optical signal to an electrical signal;
a flexible printed circuit having N third differential transmission lines formed on the flexible printed circuit;
an integrated circuit (IC); and
a housing accommodating the printed circuit board, the optical receiver subassembly, the flexible printed circuit, and the IC, wherein the electrical signal is connected to the first differential transmission lines of the printed circuit board via the third differential transmission lines of the flexible printed circuit.

* * * * *